(12) United States Patent
Pekny

(10) Patent No.: US 6,424,571 B1
(45) Date of Patent: Jul. 23, 2002

(54) SENSE AMPLIFIER WITH DATA LINE PRECHARGE THROUGH A SELF-BIAS CIRCUIT AND A PRECHARGE CIRCUIT

(75) Inventor: Ted Pekny, Campbell, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/846,981

(22) Filed: May 1, 2001

(51) Int. Cl.[7] .............................................. G11C 16/28
(52) U.S. Cl. ............................. 365/185.21; 365/185.2; 365/185.25; 365/207; 365/208; 365/210; 365/202; 365/203; 365/204; 365/190; 365/189.07; 365/189.11; 365/189.02; 365/196; 327/51; 327/52; 327/56
(58) Field of Search ........................ 365/185.21, 185.2, 365/185.25, 210, 208, 207, 204, 203, 202, 190, 189.07, 189.09, 189.11, 195, 196, 189.02; 327/56, 52, 51

(56) References Cited

U.S. PATENT DOCUMENTS

| | | | | |
|---|---|---|---|---|
| 4,592,021 A | * | 5/1986 | Suzuki et al. ................ | 365/203 |
| 5,001,668 A | * | 3/1991 | Ito et al. ................. | 365/185.25 |
| 5,453,704 A | * | 9/1995 | Kawashima .................. | 326/81 |
| 5,761,134 A | * | 6/1998 | Masuda et al. ......... | 365/189.05 |
| 5,905,686 A | | 5/1999 | Raad | |
| 5,940,338 A | | 8/1999 | Gilliam et al. | |
| 6,058,058 A | | 5/2000 | Gilliam et al. | |
| 6,088,278 A | | 7/2000 | Porter et al. | |
| 6,297,670 B1 | * | 10/2001 | Chao et al. .................... | 327/51 |

* cited by examiner

Primary Examiner—Andrew Q. Tran
(74) Attorney, Agent, or Firm—Scott Lundberg; Frog Slifer; Polglaze Leffert & Jay, P.A.

(57) ABSTRACT

A Flash memory sense amplifier precharge device having a self-bias circuit and a precharge circuit. The self-bias circuit is coupled to precharge a data node in response to a first control signal. The precharge circuit is coupled to precharge the data node in response to a second control signal, wherein the precharge circuit aids the self-bias circuit precharge the data node faster than the self-bias circuit could itself.

66 Claims, 4 Drawing Sheets

SENSE AMPLIFIER WITH DATA LINE PRECHARGE THROUGH A SELF-BIAS CIRCUIT AND A PRECHARGE CIRCUIT

TECHNICAL FIELD OF THE INVENTION

The present invention relates generally to non-volatile memories and in particular the present invention relates to precharging data lines in a non-volatile memory device.

BACKGROUND OF THE INVENTION

Memory devices are typically provided as internal storage areas in the computer. There are several different types of memory. One type of memory is random access memory (RAM) that is typically used as main memory in a computer environment. Most RAM is volatile, which means that it requires a periodic refresh of electricity to maintain its contents. Computers often contain a small amount of read-only memory (ROM) that holds instructions for starting up the computer. An EEPROM (electrically erasable programmable read-only memory) is a special type of non-volatile ROM that can be erased by exposing it to an electrical charge. Like other types of ROM, EEPROM is traditionally not as fast as RAM. EEPROM comprise a large number of memory cells having electrically isolated gates (floating gates). Data is stored in the memory cells in the form of charge on the floating gates. Charge is transported to or removed from the floating gates by programming and erase operations, respectively.

Yet another type of non-volatile memory is a Flash memory. A Flash memory is a type of EEPROM that can be erased and reprogrammed in blocks instead of one byte at a time. A typical Flash memory comprises a memory array that includes a large number of memory cells arranged in a row and column fashion. Each memory cell includes a floating gate field-effect transistor capable of holding a charge. The cells are usually grouped into erasable blocks. Each of the memory cells can be electrically programmed in a random basis by charging the floating gate. The charge can be removed from the floating gate by an erase operation. Thus, the data in a cell is determined by the presence or absence of the charge in the floating gate.

In one method of programming a memory cell, a high positive voltage Vg is applied to the gate of the cell. In addition, a moderate positive voltage is applied to the drain (Vd) and the source voltage (Vs) and the substrate voltage (Vsub) are at ground level. These conditions result in the inducement of hot electron injection in the channel region near the drain region of the memory cell. These high-energy electrons travel through the thin gate oxide towards the positive voltage present on the gate and collect on the floating gate. The electrons remain on the floating gate and function to reduce the effective threshold voltage of the cell as compared to a cell that has not been programmed. A programmed non-volatile memory cell is said to be at a logic level of "0". In Flash memories, blocks of memory cells are erased in groups. This is achieved by putting a negative voltage on the word lines of an entire block and coupling the source connection of the entire block to Vcc (power supply), or higher. This creates a field that removes electrons from the floating gates of the memory elements. In an erased state, the memory cells can be activated using a lower gate voltage. An erased non-volatile memory cell is said to be at a logic level of "1".

Non-volatile memory systems, including Flash memory systems, use a variety of sense amplifiers to verify the state of memory cells in a memory array. One method of verifying a non-volatile memory cell is accomplished by applying a potential to the gate of the cell to be verified and then using a sense amplifier to compare a current generated by the cell with a known current from a reference cell. The reference cell is a non-volatile memory cell or bit that has a predefined charge that is set or trimmed by the manufacture of the memory to produce a specific reference current. The sense amplifier determines whether the memory cell to be verified draws more or less current than the reference current. By doing this, the sense amplifier determines if the memory cell is in a programmed state or an erased state.

Before a read or verify operation is performed by a sense amplifier, global data lines that couple the memory array to the sense amplifier are often precharged to a predetermined value. The time needed to precharge the global data lines reduces the overall speed of the sense amplifier. This time limitation becomes crucial as Flash memory devices are designed to perform operations in faster and faster times.

For the reasons stated above, and for other reasons stated below which will become apparent to those skilled in the art upon reading and understanding the present specification, there is a need in the art for an improved method of precharging data lines.

SUMMARY OF THE INVENTION

The above-mentioned problems with non-volatile memory devices and other problems are addressed by the present invention and will be understood by reading and studying the following specification.

In one embodiment, a Flash memory sense amplifier precharge device is disclosed. The Flash memory sense amplifier precharge device comprises a self-bias circuit and a precharge circuit. The self-bias circuit is coupled to precharge a data node in response to a first control signal. The precharge circuit is coupled to precharge the data node in response to a second control signal, wherein the second control signal is different from the first control signal.

In another embodiment, a current sense amplifier precharge device for a non-volatile memory comprises a self-bias circuit and a precharge circuit. The self-bias circuit is coupled to precharge a data node. The precharge circuit is coupled to precharge the data node, wherein the precharge circuit supplies a current pulse to the data node to precharge the data node faster than the self-bias circuit could by itself.

In another embodiment, a current sense amplifier comprises a first self-biasing circuit, a first precharge circuit, a second self-bias circuit and a second precharge circuit. The first self-biasing circuit is coupled to a first data node to precharge the first data node in response to a first control signal. The first precharge circuit is coupled to the first data node to precharge the first data node in response to a second control signal. The second self-biasing circuit is coupled to a second data node in response the first control signal. The second precharge circuit is coupled to the second data node to precharge the second data node in response to the second control signal. Moreover, the second control signal is different from the first control signal.

In another embodiment, a non-volatile memory sense amplifier comprises a first self-bias circuit, a first precharge circuit, a second self-bias circuit, a second precharge circuit, and a comparator. The first self-bias circuit is coupled to precharge an array data node in response to a first control signal. The first precharge circuit coupled in concert with the first bias circuit to precharge the array data node in response to a second control signal. The second bias circuit is coupled to precharge a reference data node in response to the first control signal. The second precharge circuit is coupled in concert with the second bias circuit to precharge the reference data node in response to the second control signal. Moreover, the comparator is coupled to sense differences in current draw between the reference data node and the array data node.

In another embodiment, a Flash memory sense amplifier comprises, an array self-bias circuit, an array precharge circuit, an array limiting n-channel transistor, a reference self-bias circuit, a reference precharge circuit and a reference limiting n-channel transistor. The array self-bias circuit is coupled to source current to an array data node in response to a sense amplifier control signal. The array precharge circuit is used to aid the array self-bias circuit source current to the array data node in response to a precharge control signal. The array limiting n-channel transistor is coupled to the array self-bias circuit and the array precharge circuit to limit the amount of current sourced to the array data node. The reference self-bias circuit is coupled to source current to a reference data node in response to the sense amplifier control signal. The reference precharge circuit is used to aid the reference self-bias circuit source current to the reference data node in response to the precharge control signal. In addition, the reference limiting n-channel transistor is coupled to the reference self-bias circuit and the reference precharge circuit to limit the amount of current sourced to the reference data node.

In another embodiment, a Flash memory device comprises a sense amplifier, a memory array, a multiplexer circuit, a reference current draw circuit, an array data line and a matching capacitance data line. The sense amplifier comprises, a first self-bias circuit that is coupled to precharge an array data node, an array precharge circuit that is coupled to provide a current pulse in concert with the first bias circuit to precharge the array data node faster, a second bias circuit that is coupled to precharge a reference data node, a reference precharge circuit that is coupled to provide a current pulse in concert with the second bias circuit to precharge the reference data node faster, an equilibrate circuit that is coupled to equilibrate the array data node, and the reference data node and a comparator coupled to sense differences in current draw between the reference data node and the array data node. The memory array has a plurality of memory cells. The multiplexer circuit is coupled to the memory array to selectively couple the array data line and the reference data line to specific memory cells. The reference current draw circuit is coupled to the reference data node to provide a reference current draw. The array data line is coupled between the array data node and the memory array via the multiplexer circuit. The matching capacitance data line is coupled between the reference data node and the memory array via the multiplexer circuit. The array data line is precharged by the first self-bias circuit and the array precharge circuit and the matching capacitance data line is precharged by the second self-bias circuit and the reference precharge circuit.

In another embodiment, a method of precharging a data line with a sense amplifier is disclosed. The method comprising applying a first control signal to a self-bias circuit coupled to precharge the data line and applying a second control signal to a precharge circuit coupled to precharge the data line in concert with the self-bias circuit, wherein the second control signal is different from the first control signal.

In another embodiment, a method of precharging a data line with a sense amplifier is disclosed. The method comprising, activating a relatively small p-channel pull-up transistor in a diode configuration that has a source coupled to a voltage source and a drain selectively coupled to the data line and activating a n-channel pull-up transistor for a predetermined time period, the n-channel pull-up transistor having a drain selectively coupled to the voltage source and a source selectively coupled to the data line to aid the p-channel pull-up transistor precharge the data line.

In another embodiment, a method of operating a Flash memory sense amplifier is disclosed. The method comprising, initiating a read operation on a memory cell, activating an equilibrate circuit to equilibrate nodes within the sense amplifier, precharging a pair of global data lines with a pair of self-bias circuits, precharging the global data lines faster with an additional current pulse from a pair of n-channel pull-up transistors located in the sense amplifier and comparing a current draw of the memory cell coupled to one of the global data lines with a current draw of a reference cell.

In yet another embodiment, a method of operating a Flash memory is disclosed. The method comprising initiating a read operation of a memory cell in a memory array, enabling a sense amplifier with a sense amplifier control signal, activating an equilibrate circuit to equilibrate nodes within the sense amplifier, activating a first self-bias circuit within an array circuit of the sense amplifier to precharge an array data line, activating an array precharge circuit within the sense amplifier to provide a current pulse to the array data line to aid the array self-bias circuit precharge the array data line, activating a second self-bias circuit within a reference circuit of the sense amplifier to precharge a matching capacitance data line, activating a reference precharge circuit within the sense amplifier to provide a current pulse to the matching capacitance data line to aid the reference self-bias circuit precharge the matching capacitance data line, deactivating the equilibrate circuit and sensing a difference in current draw between the memory cell and a reference cell to determine a program state of the memory cell.

DETAILED DESCRIPTION OF THE INVENTION

In the following detailed description of the preferred embodiments, reference is made to the accompanying drawings, which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only by the claims and the equivalence thereof.

The present invention reduces the time required to precharge data lines. The present invention uses n-channel transistors to source current to data nodes coupled to the data lines. In addition, the present invention is designed to reduce the possibility of over-charging the data lines. To better understand the present invention, further background is first provided.

Figure 1:
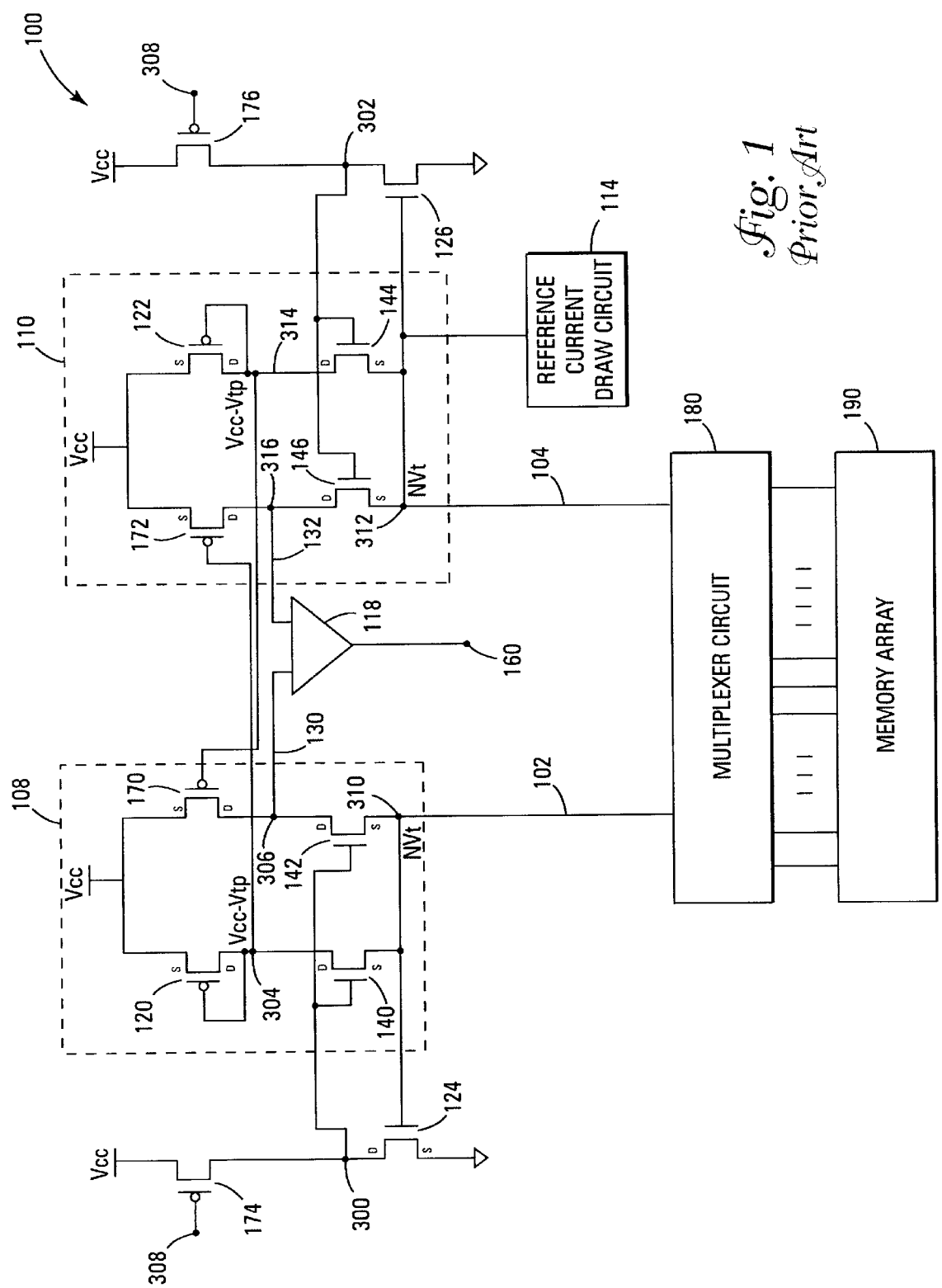
FIG. 1 is a schematic diagram of a sense amplifier of the prior art.

Referring to FIG. 1, a simplified schematic drawing of a sense amplifier 100 of the prior art is illustrated. The sense amplifier 100 is illustrated as having an array data line 102 and reference data line 104. Data lines 102 and 104 are commonly referred to as global data lines 102, 104. The array data line 102 is coupled to conduct current of a memory cell in a memory array 190 that is being read or verified. A pair of self-bias circuits 108 and 110 are coupled to the global data lines 102 and 104. Specifically, the array self-bias circuit 108 is coupled to the array data line 102 and the reference self-bias circuit 110 is coupled to the reference data line 104. A reference current draw circuit 114 is coupled to the reference self-bias circuit 110 at node 312. The reference current draw circuit 114 is a mirror circuit common in the art that creates a current draw that is equal to the current draw of a reference cell when it is being read. Since mirror circuits are well known in the art, a detailed description of their operation is not provided herein.

A comparator 118 is used to compare signal differentials. The comparator is coupled to receive signals from the array self-bias circuit 108 and the reference self-bias circuit 110. In particular, interior signal line 132 couples the array self-bias circuit 108 to n-channel transistor 152 of the comparator 118. Moreover, interior signal line 130 couples the reference self-bias circuit 110 to n-channel transistor 150 of the comparator 118. The comparator 118 compares signal differentials in interior signal line 132 and interior signal line 130 in providing an output signal. Comparator circuits are well known in the art, and a detailed description of their operation is not provided herein.

The global data lines 102 and 104 tend to have a relatively large capacitance and are essentially at ground potential prior to the activation of the sense amplifier 100. To ensure proper operation, the global data lines 102, 104 are precharged to a specific voltage level. Typically, in the prior art, the global data lines are precharged with self-bias circuits. For example, as illustrated in FIG. 1, global data lines or data lines 102 and 104 are respectively precharged by first and second self-bias circuits 108 and 110. The first self-bias circuit 108 can also be referred to as an array self-bias circuit 108 and the second self-bias circuit 110 can also be referred to as a reference self-bias circuit 110. The array self-bias circuit 108 includes a relatively small p-channel pull-up transistor 120. The reference self-bias circuit 110 also includes a relatively small p-channel pull-up transistor 122.

Referring to the array self-bias circuit 108 in FIG. 1, p-channel transistor 120 is coupled in a diode configuration having its source coupled to a voltage source (Vcc) and its gate coupled to its drain. The gates of n-channel transistor 140 and n-channel transistor 142 are coupled to node 300. A low logic first control signal applied to node 308 activates sense amplifier 100. This first control signal can also be referred to as a sense amplifier control signal. The voltage on node 304 between p-transistor 120 and n-transistor 140 of the array self-bias circuit 108 is Vcc−Vtp after the sense amplifier 100 is activated. Similarly, the voltage on node 306 between p-transistor 170 and n-transistor 142 of the array self-bias circuit 108 is also at Vcc−Vtp after activation. Moreover, the sense amplifier control signal activates p-transistor 174 thereby allowing Vcc to be coupled to the gates of n-transistors 140 and 142. Since the drain of n-transistor 124 is coupled to the gates of n-transistors 140 and 142, and the sources of n-transistors 140 and 142 are coupled to the gate of n-transistor 124, a feedback loop is formed. This configuration produces a steady-state voltage level of Vtn at the array data node 310. Since the array data line 102 is coupled to the array data node 310, once Vtn has been reached on the array data node 310, the array data line 102 is precharged to Vtn. Data nodes 310 and 312 can also be referred to as the first data node 310 and the second data node 312.

Since the reference self-bias circuit 110 is a mirror of the array circuit 108, the same configuration is used to precharge the reference data line 104. Referring to the reference self-bias circuit 110, p-channel transistor 122 is coupled in a diode configuration having its source couple to a voltage source (Vcc) and its gate coupled to its drain. As shown, the gates of n-transistor 144 and n-transistor 146 are coupled to node 302. Applying the sense amplifier control signal to node 308 activates the sense amplifier 100. The voltage on node 314 between p-transistor 122 and n-transistor 144 of the array circuit 110 is Vcc−Vtp after the sense amplifier 100 is activated. Similarly, the voltage on the node 316 between p-transistor 172 and n-transistor 144 of the array circuit 110 is also Vcc−Vtp. Moreover, the sense amplifier control signal activates p-transistor 176, thereby allowing Vcc to be coupled to the gates of n-transistors 144 and 146. Since the drain of n-transistor 126 is coupled to the gates of n-transistors 144 and 146, and the sources of n-transistors 144 and 146 are coupled to the gate of n-transistor 126, a feedback loop is formed. The result of this configuration is that n-transistors 126, 144, and 146 balance each other out, resulting in a voltage level of Vtn at the reference data node 312. Since the reference data line 104 is coupled to the reference data node 312, once Vtn has been reached on the reference data node 312, the reference data line 104 is precharge to Vtn.

As illustrated in FIG. 1, the gate of p-channel transistor 170 of the array self-bias circuit 108 is coupled to a drain of p-channel transistor 122 of the reference self-bias circuit 110. In addition, the gate of p-channel transistor 172 of the reference self-bias circuit 110 is coupled to a drain of p-channel transistor 120 of the array self-bias circuit 108. The global data lines 102 and 104 are precharged together. Moreover, the array data line 102 and the reference data line 104 generally have the same length and capacitance so they can be pulled up at the same rate. In fact, in this embodiment of the prior art, the reference data line 104 is used to match the capacitance of the array data line 102 during the precharge. Accordingly, the reference data line 104 could also be referred to as a matching capacitance data line 104. As a result of this arrangement, the reference self-bias circuit 110 and the array self-bias circuit 108 pull up the global data lines 102 and 104 generally at the same rate.

To provide a better understanding, a block diagram of a multiplexer circuit 180 and a memory array 190 are also illustrated in FIG. 1. As illustrated, the global data lines 102 and 104 are coupled to the memory array 190 via the multiplexer circuit 180. The multiplexer circuit contains multiplexers that selectively couple the global data lines to specific memory cells in the memory array. When a read operation is performed on a specific memory cell in the memory array 190, the multiplexer circuit 180, in this embodiment of the prior art, couples the memory cell being read to the array data node 310 via the array data line 102. An output of the sense amplifier 100 is given at node 160.

A problem with using self-bias circuits to charge up data lines in the prior art, is the amount of time it takes to get the data lines up to Vtn. Because of the relatively large capacitance of the global data lines 102 and 104, it takes a long time for the relatively small p-channel transistors 120 and 122 to pull-up the global data lines 102 and 104. This slows the sense amplifier 100 down because, for accuracy reasons, it is desired to have the data lines 102 and 104 pulled up before the sense amplifier starts sensing.

Figure 2:
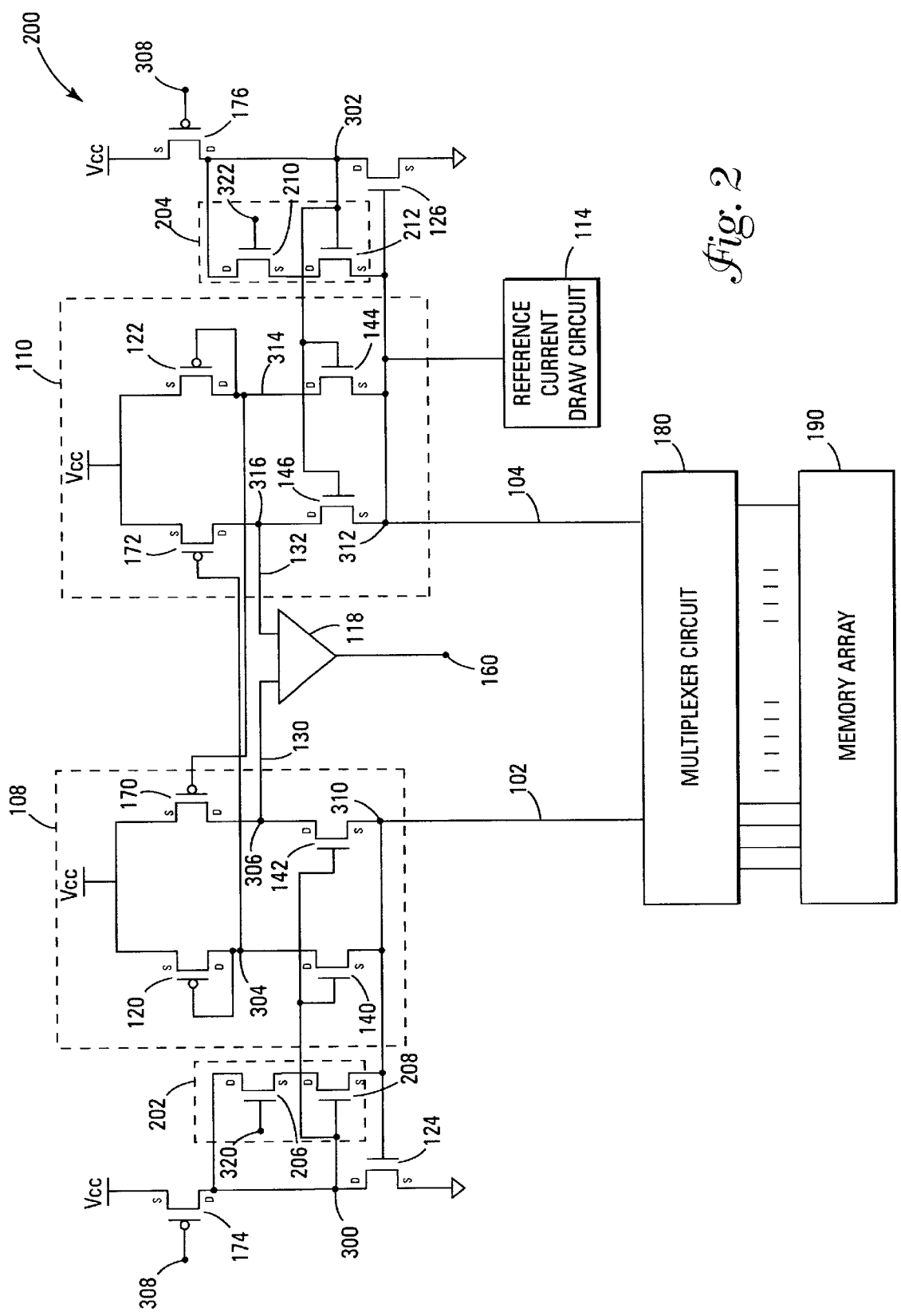
FIG. 2 is a schematic diagram of one embodiment of the present invention.

Referring to FIG. 2, one embodiment of the present invention is illustrated. In the present invention, additional precharge circuits 202 and 204 are used to precharge the global data lines 102 and 104 in a more rapid fashion. An array precharge circuit 202 is used to precharge the array data line 102 and a reference precharge circuit 204 is used to precharge the reference data line 104. The array precharge circuit 202 includes n-channel transistors 206 and 208. The reference precharge circuit 204 includes n-channel transistors 210 and 212. The array precharge circuit 202 can also be referred to as a first precharge circuit 202 and the reference precharge circuit 204 can also be referred to as a second precharge circuit 204.

N-channel transistor 208 of the array data line precharge circuit 202 is coupled in parallel with n-transistors 140 and 142 of array self-bias circuit 108 so the gates of n-channel transistors 208, 140 and 142 are coupled to node 300. N-channel transistors 208, 140 and 142 can be referred to as pass-through transistors. Since their gates share the same node, they share the same entity bias. Similarly, n-channel transistor 212 of reference data line precharge circuit 204 is coupled in parallel with n-channel transistors 144 and 146 so the gates of n-channel transistors 212, 144 and 146 are coupled to node 302. N-channel transistors 212, 144 and 146 can also be referred to as pass-through transistors. Moreover, since their gates share the same node, they share the same entity bias.

N-channel transistor 206 of array precharge circuit 202 is coupled between n-channel transistor 208 and p-channel transistor 174. N-channel transistor 206 is a pull-up transistor that is normally off. N-channel transistor 206 is activated by a second control signal or a precharge control signal that is applied to node 320. The precharge control signal is actually a pulse signal that is applied to node 320 for a predetermined time period. While activated, n-channel transistor 206 sources more current to the array data line 102 to precharge the array data line 102 to Vtn faster than the p-channel transistor 120 in the array self-bias circuit 108 could itself. Moreover, in one embodiment, the precharge control signal is applied to node 320 and the sense amplifier control signal is applied to node 308 starting at approximately the same time.

In addition, n-channel transistor 210 of the reference precharge circuit 204 is coupled between n-channel transistor 212 and p-channel transistor 176. N-channel transistor 210 is a pull-up device that is normally off. N-channel transistor 210 is also activated by the second control signal or precharge control signal that is applied to node 322. As stated above, the precharge control signal is actually a pulse signal that is applied to node 322 for a predetermined time period. While activated, n-channel transistor 210 sources more current to the reference data line 104 to precharge the reference data line 104 to Vtn faster than the small p-channel transistor 122 in the reference self-bias circuit 110 could by itself. Moreover, in one embodiment, the precharge control signal is applied to node 322 and the sense amplifier control signal is applied to node 308 starting at approximately the same time.

As illustrated, the drain of n-channel transistor 206 of the array precharge circuit 202 is coupled to node 300. A source of n-channel transistor 206 is coupled to the drain of n-channel transistor 208 of the array precharge circuit 202. A source of n-channel transistor 208 is coupled to array data node 310. When the sense amplifier control signal is received on node 308, p-channel transistor 174 is activated thereby coupling Vcc to node 310. In concert with the sense amplifier control signal being applied to node 308, the precharge control signal is applied to node 320. As a result, a voltage of about Vcc–Vtp is coupled to the drain of n-transistor 208.

The gates of n-transistors 208, 140 and 142 and a drain of n-channel transistor 124 are coupled to node 300. The sources of n-transistors 208, 140 and 142 and the gate of n-transistor 124 are coupled to array data node 310 forming a feedback loop. Because of this arrangement, n-channel transistor 124 and n-channel transistors 208, 140 and 142 balance each other out to produce a steady-state voltage level of Vtn. As a result of this balancing, n-channel transistor 124 is turned on slightly allowing a small current flow to ground. N-channel transistor 124 can be referred to as an array voltage limiting n-channel transistor 124 because it limits the voltage that is applied to the array data node 310. This reduces the risk of over charging the array data line 102 as compared to a data line precharge circuit that was external to the sense amplifier. Moreover, when the voltage level on array data node 310 reaches Vtn, the array data line 102 is precharged to Vtn. In one embodiment, Vtn is approximately 0.8 Volts.

The reference precharge circuit 204 is a mirror of the array precharge circuit 202. The drain of n-channel transistor 210 of the reference precharge circuit 204 is coupled to node 302. The source of n-channel transistor 210 is coupled to the drain of n-channel transistor 212 of the reference precharge circuit 204. The source of n-channel transistor 212 is coupled to reference data node 312. When the sense amplifier control signal is received on node 308, p-channel transistor 176 is activated thereby coupling Vcc to node 302. In concert with the sense amplifier control signal being applied to node 308, the precharge control signal is applied to node 322. This activates n-channel transistor 210. As a result, a voltage of about Vcc–Vtp is coupled to the drain of n-transistor 212.

The gates of n-transistors 212, 144 and 146 and a drain of n-channel transistor 126 are coupled to 302. The sources of n-transistors 212, 144 and 146 and the gate of n-transistor 126 are coupled to reference data node 312 to form a feedback loop. Because of this arrangement, n-channel transistor 126 and n-channel transistors 212, 144 and 146 balance each other out to produce a steady-state voltage level of Vtn. As a result of this balancing, n-channel transistor 126 is turned on slightly allowing a small current flow to ground. N-channel transistor 126 can be referred to as a reference voltage limiting n-channel transistor 126 because it limits the voltage that is applied to the reference data node 312. This reduces the risk of over charging the reference data line 104 as compared to a data line precharge circuit that was external to the sense amplifier. Moreover, when the voltage level on reference data node 312 reaches Vtn, the reference data line 104 is precharged to Vtn. In one embodiment, Vtn is approximately 0.8 Volts.

Figure 3:
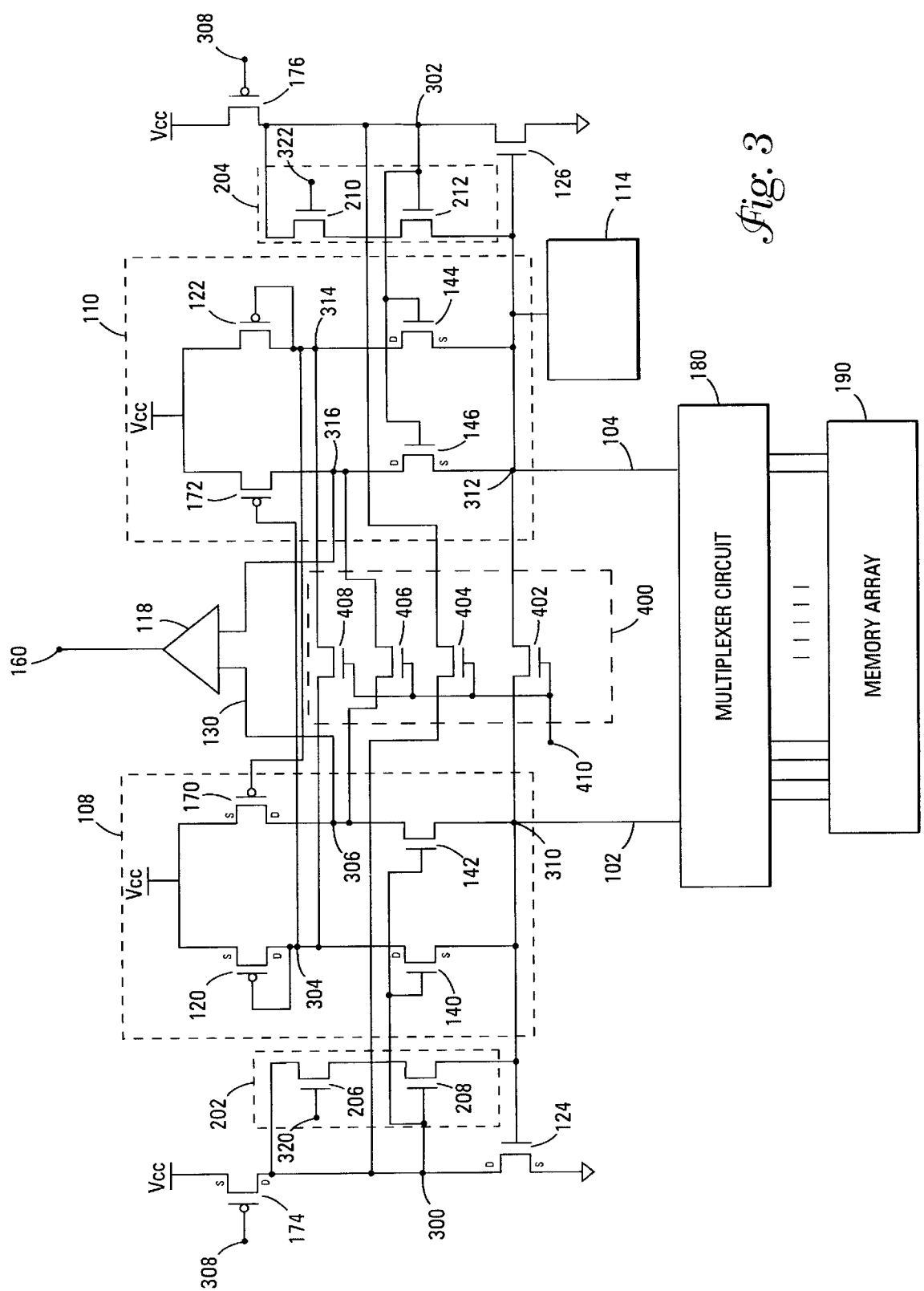
FIG. 3 is a schematic diagram of one embodiment of the present invention, illustrating an equilibrate circuit.

In one embodiment of the present invention, an equilibrate circuit 400 in the sense amplifier 200 is activated in concert with the array precharge circuit 202, the reference precharge circuit 204, the array self-bias circuit 108 and the reference self-bias circuit 110. The equilibrate circuit 400 is used to equalize nodes within the sense amplifier 200 before a sense operation takes place. Equalizing the nodes before sensing takes place increases the speed of a sense operation and improves accuracy. Referring to FIG. 3, one embodiment of the equilibrate circuit 400 is illustrated. The equilibrate circuit 400 includes n-channel transistors 402, 404, 406, and 408. The equilibrate circuit 400 equalizes the nodes within the sense amplifier, including the array data node 310 and the reference data node 312. For example, in this embodiment, the equilibrate circuit 400 equalizes node 300 and node 302 with n-channel transistor 404, node 310 and node 312 with n-channel transistor 402, node 304 and node 314 with n-channel 408, and node 306 and node 316 with n-channel transistor 406. The equilibrate circuit 400 is activated by applying a third control signal to node 410. The third control signal can also be referred to as the equilibrate control signal.

Figure 4:
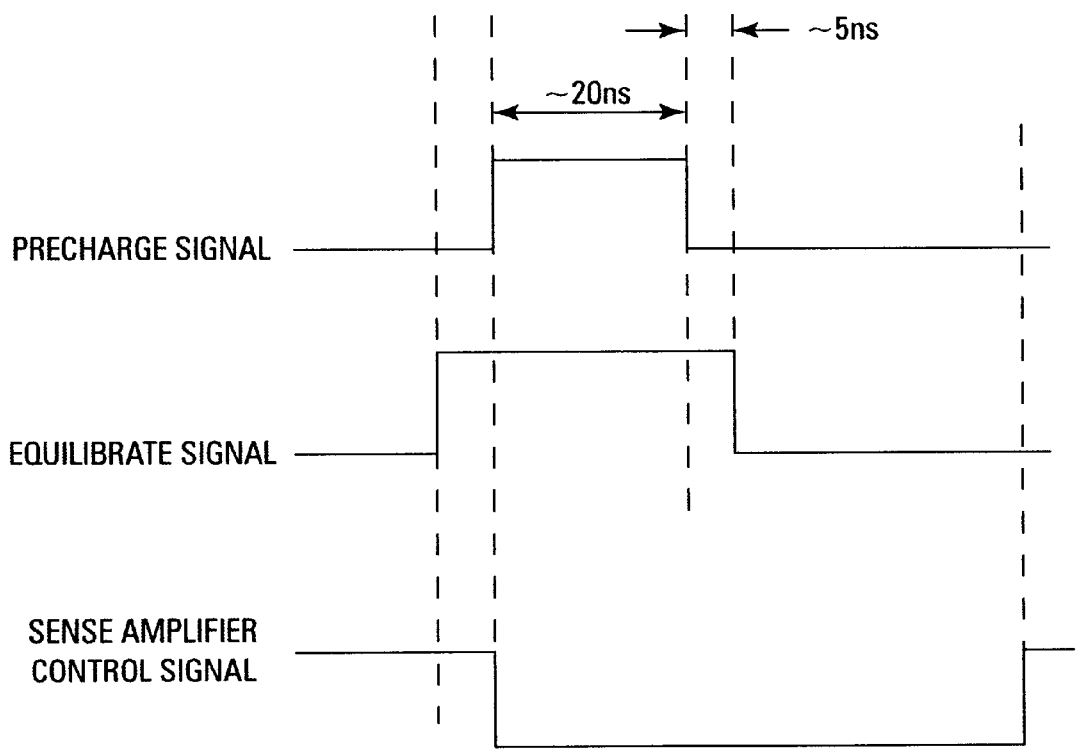
FIG. 4 is a timing diagram of one embodiment of the present invention.

Referring to FIG. 4, a timing diagram of one embodiment of the present invention is illustrated. In this embodiment, the equilibrate control signal is applied to node 410 slightly before the precharge signal and the sense amplifier control signal is applied to their respective nodes. In this embodiment, the precharge control signal is applied to node 320 and node 322 for approximately 20 ns. Because the precharge signal is only applied to the array precharge circuit 202 and the reference precharge circuit 204 for a predetermined time period, the array precharge circuit 202 and the reference precharge circuit 204 do not interfere with normal operation of the sense amplifier 200 during other operation times.

Moreover, in one embodiment, the equilibrate control signal is applied longer than the precharge control signal by approximately 5 ns. In this embodiment, once the equilibrate control signal ends, the comparator 118 of the sensing amplifier 200 compares the current draw through the array data node 310 with the current draw through the reference data node 312. The current draw trough reference data node 312 is weighted in some relationship to the memory cell being read. In comparing the current draw, the sense amplifier 200 verifies the program state of the memory cell. An output of the comparator circuit 118 is read off of a sense amplifier output node 160. Moreover, the output of the sense amplifier 200 in one embodiment can be read off node 160 approximately 4ns after the equilibrate signal goes low.

As described above, the present invention precharges the array data line 102 and the reference data line 104 together with the use of a precharge control signal coupled to node 320 of the array precharge circuit 202 and node 322 of the reference precharge circuit 204. The reduction in time gained by the present invention, in precharge global data lines 102 and 104, as compared to the prior art, is a function of the architecture of the die containing the global data lines. The higher the capacitance of the global data lines, the greater the time savings. It would be expected that a reduction of approximately 5 ns in precharging time could be achieved in a typical die with the present invention.

CONCLUSION

A Flash memory sense amplifier precharge device having a self-bias circuit and a precharge circuit has been described. The self-bias circuit is coupled to precharge a data node in response to a first control signal. The precharge circuit is coupled to precharge the data node in response to a second control signal, wherein the precharge circuit aids the self-bias circuit precharge the data node faster than the self-bias circuit could itself.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A Flash memory sense amplifier precharge device comprising:

a self-bias circuit coupled to precharge a data node in response to a first control signal; and a precharge circuit coupled to precharge the data node in response to a second control signal, wherein the second control signal is different from the first control signal.

2. The Flash memory sense amplifier precharge device of claim 1 wherein the precharge circuit aids the self-bias circuit precharge the data node faster than the self-bias circuit could itself.

3. The Flash memory sense amplifier precharge device of claim 1 wherein the self-bias circuit comprises:

a p-channel pull-up transistor in a diode configuration.

4. The Flash memory sense amplifier precharge device of claim 1 wherein the precharge circuit comprises an n-channel pull-up transistor, wherein the second control signal is coupled to a gate of the n-channel pull-up transistor.

5. The Flash memory sense amplifier precharge device of claim 4 wherein the precharge circuit further comprises:

an n-channel pass-through transistor coupled between the pull-up transistor and the data node to selectively pass current.

6. A current sense amplifier precharge device for a non-volatile memory comprising:

a self-bias circuit coupled to precharge a data node; and a precharge circuit coupled to precharge the data node, wherein the precharge circuit supplies a current pulse to the data node to precharge the data node faster than the self-bias circuit could by itself.

7. The current sense amplifier precharge device for a non-volatile memory of claim 6 wherein the self-bias circuit comprises:

a relatively small p-channel transistor having a source coupled to a voltage source, the p-channel transistor further having a drain selectively coupled to the data node, the p-channel transistor also having a gate coupled to its drain to form a diode.

8. The current sense amplifier precharge device for a non-volatile memory of claim 6 further comprising:

a voltage limiting n-channel transistor coupled in a feedback loop with the self-bias circuit and the precharge circuit to limit the amount of charge placed on the data node.

9. The current sense amplifier precharge device for a non-volatile memory of claim 6 wherein the precharge circuit comprises:

an n-channel pull-up transistor having a gate coupled to receive a precharge control signal, the n-channel pull-up transistor further having a drain selectively coupled to a voltage source; and an n-channel pass-through transistor, the n-channel pass-through transistor having a drain coupled to a source of the n-channel pull-up transistor, the n-channel pass-through transistor further having a source coupled to the data node, the n-channel pass-through transistor also having a gate selectively coupled to the voltage source.

10. The current sense amplifier precharge device for a non-volatile memory of claim 9 wherein the precharge control signal is applied to the gate of the n-channel pull-up transistor for a predetermined time period.

11. A current sense amplifier comprising:
   a first self-biasing circuit coupled to a first data node to precharge the first data node in response to a first control signal;
   a first precharge circuit coupled to the first data node to precharge the first data node in response to a second control signal;
   a second self-biasing circuit coupled to a second data node to precharge the second data node in response to the first control signal; and
   a second precharge circuit coupled to the second data node to precharge the second data node in response to the second control signal, wherein the second control signal is different from the first control signal.

12. The current sense amplifier of claim 11 further comprising:
   a comparator selectively coupled to compare voltages on the first and second data nodes.

13. The current sense amplifier of claim 11 wherein, the first precharge circuit comprises:
   a first n-channel pull-up transistor coupled to source current to the first data node.

14. The current sense amplifier of claim 11 wherein, the second precharge circuit comprises:
   a second n-channel pull-up transistor coupled to source current to the second data node.

15. The current sense amplifier of claim 11 further comprising:
   an equilibrate circuit coupled to the first and second data nodes.

16. The current sense amplifier of claim 15 wherein the equilibrate circuit is activated by a third control signal.

17. The current sense amplifier of claim 16 wherein the third control signal is applied to the equilibrate circuit approximately 5 ns longer than the second control signal is applied to the first and second precharge circuits.

18. A non-volatile memory sense amplifier comprising:
   a first self-bias circuit coupled to precharge an array data node in response to a first control signal;
   first precharge circuit coupled in concert with the first bias circuit to precharge the array data node in response to a second control signal;
   a second self-bias circuit coupled to precharge a reference data node in response to the first control signal;
   a second precharge circuit coupled in concert with the second bias circuit to precharge the reference data node in response to the second control signal; and
   a comparator coupled to sense differences in current draw between the reference data node and the array data node.

19. The non-volatile memory sense amplifier of claim 18 further comprising:
   a first voltage limiting n-channel transistor coupled in a feedback loop with the first self-bias circuit and the first precharge circuit to limit the amount of charge placed on the array data node; and
   a second voltage limiting n-channel transistor coupled in a feedback loop with the second self-bias circuit and the second precharge circuit to limit the amount of charge placed on the reference data node.

20. The non-volatile memory sense amplifier of claim 18 further comprising:
   an equilibrate circuit coupled to equilibrate the array data node with the reference data node.

21. The non-volatile memory sense amplifier of claim 18 wherein the first self-bias circuit and second self-bias circuit each comprise a p-channel transistor coupled in a diode configuration.

22. The non-volatile memory sense amplifier of claim 18 wherein the second control signal is applied for a predetermined time period.

23. The non-volatile memory sense amplifier of claim 22 wherein the second control signal is applied approximately at the same time when the first control signal is applied.

24. The non-volatile memory sense amplifier of claim 22 wherein the predetermined time period of the second control signal is approximately 20 ns.

25. The non-volatile memory sense amplifier of claim 18 wherein the first and the second precharge circuit comprises:
   an n-channel pull-up transistor having a gate coupled to receive the second control signal, the n-channel pull-up transistor further having a drain selectively coupled to a voltage source; and
   an n-channel pass-through transistor coupled between a source of the n-channel pull-up transistor and the array data node, further wherein a gate of the n-channel pass-through transistor is selectively coupled to the voltage source.

26. The non-volatile memory sense amplifier of claim 25 wherein the n-channel pull-up transistor is activated by the second control signal.

27. The non-volatile memory sense amplifier of claim 18 wherein the second precharge circuit comprises:
   an n-channel pull-up transistor having a gate coupled to receive the second control signal, the n-channel pull-up transistor further having a drain selectively coupled to a voltage source; and
   an n-channel pass-through transistor coupled between the n-channel pull-up transistor and the reference data node, further wherein a gate of the n-channel pass-through transistor is selectively coupled to the voltage source.

28. The non-volatile memory sense amplifier of claim 27 wherein the n-channel pull-up transistor is activated by the second control signal.

29. A Flash memory sense amplifier comprising:
   an array self-bias circuit coupled to source current to an array data node in response to a sense amplifier control signal;
   an array precharge circuit to aid the array self-bias circuit source current to the array data node in response to a precharge control signal;
   an array limiting n-channel transistor coupled to the array self-bias circuit and the array precharge circuit to limit the amount of current sourced to the array data node;
   a reference self-bias circuit coupled to source current to a reference data node in response to the sense amplifier control signal;
   a reference precharge circuit to aid the reference self-bias circuit source current to the reference data node in response to the precharge control signal; and
   a reference limiting n-channel transistor coupled to the reference self-bias circuit and the reference precharge circuit to limit the amount of current sourced to the reference data node.

30. The Flash memory sense amplifier of claim 29 further comprising:
an equilibrate circuit coupled to equilibrate the array data node with the reference data node in response to an equilibrate signal.

31. The Flash memory sense amplifier of claim 29 wherein the array precharge circuit comprises:
an n-channel pull-up transistor having a gate coupled to receive said precharge control signal, the n-channel pull-up transistor further having a drain selectively coupled to a voltage source; and
an n-channel pass-through transistor, the n-channel pass-through transistor having a drain coupled to the source of the n-channel pull-up transistor, the n-channel pass-through transistor further having a source coupled to the array data node, the n-channel pass-through transistor also having a gate selectively coupled to the voltage source.

32. The Flash memory sense amplifier of claim 31 wherein the array limiting n-channel transistor having a drain selectively coupled to the voltage source, the array limiting n-channel transistor further having a source coupled to a ground voltage, the array limiting n-channel transistor also having a gate coupled to the array data node.

33. The Flash memory sense amplifier of claim 29 wherein the reference precharge circuit comprises:
an n-channel pull-up transistor having a gate coupled to receive said precharge control signal, the n-channel pull-up transistor further having a drain selectively coupled to a voltage source; and
an n-channel pass-through transistor, the n-channel pass-through transistor having a drain coupled to the source of the n-channel pull-up transistor, the n-channel pass-through transistor further having a source coupled to the reference data node, the n-channel pass-through transistor also having a gate selectively coupled to the voltage source.

34. The Flash memory sense amplifier of claim 33 wherein the reference limiting n-channel transistor having a drain selectively coupled to the voltage source, the reference limiting n-channel transistor further having a source coupled to a ground voltage, the reference limiting n-channel transistor also having a gate coupled to the reference data node.

35. A Flash memory device comprising:
a sense amplifier, the sense amplifier comprising,
a first self-bias circuit coupled to precharge an array data node,
an array precharge circuit coupled to provide a current pulse in concert with the first bias circuit to precharge the array data node faster,
a second self-bias circuit coupled to precharge a reference data node,
a reference precharge circuit coupled to provide a current pulse in concert with the second bias circuit to precharge the reference data node faster,
a equilibrate circuit coupled to equilibrate the array data node and the reference data node, and
a comparator coupled to sense differences in current draw between the reference data node and the array data node;
a memory array having a plurality of memory cells;
a multiplexer circuit coupled to the memory array to selectively couple an array data line and a reference data line to specific memory cells;
a reference current draw circuit coupled to the reference data node to provide a reference current draw;
the array data line coupled between the array data node and the memory array via the multiplexer circuit; and
a matching capacitance data line coupled between the reference data node and the memory array via the multiplexer circuit, wherein the array data line is precharged by the first self-bias circuit and the array precharge circuit and the matching capacitance data line is precharged by the second self-bias circuit and the reference precharge circuit.

36. The Flash memory device of claim 35 wherein the multiplexer circuit couples memory cells to be read to the array data line.

37. The Flash memory device of claim 35 wherein the matching capacitance data line is used to match the capacitance load of the array date line so both data lines are precharged at the same rate.

38. The Flash memory device of claim 35 wherein the array data line and the matching data line are precharged to approximately 0.8 volts.

39. The Flash memory device of claim 35 wherein the first and second self-bias circuits each comprise:
a p-channel transistor having a source coupled to a voltage source and a gate coupled to a drain of the p-channel transistor to form a diode.

40. The Flash memory device of claim 39 wherein the p-channel transistor of the first self-bias circuit further has a drain selectively coupled to the array data node.

41. The Flash memory device of claim 39 wherein the p-channel transistor of the second self-bias circuit further has a drain selectively coupled to the reference data node.

42. The Flash memory device of claim 35 wherein the array precharge circuit comprises:
an n-channel pull-up transistor, the pull-up transistor having a gate coupled to receive a precharge control signal, the pull-up transistor further having a drain selectively coupled to a voltage source; and
an n-channel pass-through transistor, the pass-through transistor having a drain coupled to a source of the pull-up transistor, the pass-through transistor further having a source coupled to the array data node, the pass-through transistor also having a gate selectively coupled to the voltage source.

43. The Flash memory device of 42 wherein the precharge control signal is applied to the gate of the pull-up transistor for a predetermined time period.

44. The Flash memory device of claim 35 wherein the reference precharge circuit comprises:
an n-channel pull-up transistor, the pull-up transistor having a gate coupled to receive a precharge control signal, the pull-up transistor further having a drain selectively coupled to a voltage source; and
an n-channel pass-through transistor, the pass-through transistor having a drain coupled to a source of the pull-up transistor, the pass-through transistor further having a source coupled to the reference data node, the pass-through transistor also having a gate selectively coupled to the voltage source.

45. The Flash memory device of claim 44 wherein the precharge control signal is applied to the gate of the pull-up transistor for a predetermined time period.

46. A method of precharging a data line with a sense amplifier comprising:
applying a first control signal to a self-bias circuit coupled to precharge the data line; and
applying a second control signal to a precharge circuit coupled to precharge the data line in concert with the self-bias circuit, wherein the second control signal is different from the first control signal.

47. The method of claim 46 wherein the second control signal is applied for a predetermined time period.

48. The method of claim 47 wherein the second control signal is applied for approximately 20 ns.

49. The method of claim 46 wherein the first control signal is applied to the self-bias circuit and the second control signal is applied to the precharge circuit starting approximately at the same time.

50. A method of precharging a data line with a sense amplifier comprising:

activating a relatively small p-channel pull-up transistor in a diode configuration that has a source coupled to a voltage source and a drain selectively coupled to the data line; and activating a n-channel pull-up transistor for a predetermined time period, the n-channel pull-up transistor having a drain selectively coupled to the voltage source and a source selectively coupled to the data line to aid the p-channel pull-up transistor precharge the data line.

51. The method of claim 50 further comprising:

activating a first n-channel pass-through transistor coupled between the p-channel pull-up transistor and the data line; and activating a second n-channel pass-through transistor coupled between the n-channel pull-up transistor and the data line, wherein a gate of the first n-channel pass-through transistor and a gate of the second n-channel pass-through transistor are coupled together.

52. The method of claim 51 further comprising:

limiting the charge placed on the data line with a voltage limiting n-channel transistor.

53. The method of claim 52 wherein the voltage limiting n-channel transistor has a gate coupled to the data line, the voltage limiting n-channel transistor further having a drain selectively coupled to the voltage source and the gates of the first and second pass-through transistors, the voltage limiting n-channel transistor also having a source coupled to a ground voltage.

54. The method of claim 50 wherein the n-channel pull-up transistor is activated for said predetermined time period.

55. The method of claim 50 wherein the data line is precharged to approximately 0.8 volts.

56. A method of operating a Flash memory sense amplifier comprising:

initiating a read operation on a memory cell;

activating an equilibrate circuit to equilibrate nodes within the sense amplifier;

precharging a pair of global data lines with a pair of self-bias circuits;

precharging the global data lines faster with an additional current pulse from a pair of n-channel pull-up transistors located in the sense amplifier; and comparing a current draw of the memory cell coupled to one of the global data lines with a current draw of a reference cell.

57. The method of claim 56 wherein the global data lines are precharged at the same rate.

58. The method of claim 56 wherein each self-bias circuit comprises a relatively small p-channel pull-up transistor coupled in a diode configuration.

59. The method of claim 56 wherein precharging each global data line faster with an additional current pulse from an n-channel pull-up transistor located in the sense amplifier comprises:

providing a precharge control signal to a gate of the n-channel pull-up transistor for a predetermined time period to activate the n-channel pull-up transistor;

activating a n-channel pass-through transistor; and activating a voltage limiting n-channel transistor coupled in a feedback loop with the n-channel pass-through transistor thereby limiting charge on the global data line to reduce the risk of overcharging the global data line.

60. The method of claim 56 wherein the equilibrate circuit remains activated for approximately 5 ns after the additional current pulse from the pair of n-channel pull-up transistors located in the sense amplifier have been applied to the global data lines.

61. The method of claim 56 wherein the comparing of current draw between the global data lines occurs once the equilibrate circuit is deactivated.

62. A method of operating a Flash memory comprising:

initiating a read operation of a memory cell in a memory array;

enabling a sense amplifier with a sense amplifier control signal;

activating an equilibrate circuit to equilibrate nodes within the sense amplifier;

activating a first self-bias circuit within an array circuit of the sense amplifier to precharge an array data line;

activating an array precharge circuit within the sense amplifier to provide a current pulse to the array data line to aid the array self-bias circuit precharge the array data line;

activating a second self-bias circuit within a reference circuit of the sense amplifier to precharge a matching capacitance data line;

activating a reference precharge circuit within the sense amplifier to provide a current pulse to the matching capacitance data line to aid the reference self-bias circuit precharge the matching capacitance data line;

deactivating the equilibrate circuit; and sensing a difference in current draw between the memory cell and a reference cell to determine a program state of the memory cell.

63. The method of claim 62 wherein the array precharge circuit and the reference precharge circuit are both activated by a precharge control signal that is applied approximately at the same time when the sense amplifier receives the sense amplifier control signal.

64. The method of claim 62 wherein the array precharge circuit and the reference precharge circuit both apply their current pulse to their respective data line for approximately 20 ns.

65. The method of claim 62 wherein the equilibrate circuit is activated longer than the array precharge circuit and the reference precharge circuit.

66. The method of claim 65 wherein the equilibrate circuit is activated approximately 5 ns longer than the array precharge circuit and the reference precharge circuit.

* * * * *

UNITED STATES PATENT AND TRADEMARK OFFICE
CERTIFICATE OF CORRECTION

PATENT NO.    : 6,424,571 B1
DATED         : June 5, 2001
INVENTOR(S)   : Donald P. Knowles et al.

It is certified that error appears in the above-identified patent and that said Letters Patent is hereby corrected as shown below:

<u>Title page,</u>
Item [73], should read:
-- Assignees:   The United States of America as represented by the Secretary of Agriculture, Washington, D.C. Washington State University Research Foundation, Pullman, WA --

Signed and Sealed this

Thirty-first Day of December, 2002

JAMES E. ROGAN
*Director of the United States Patent and Trademark Office*